(12) United States Patent
Li et al.

(10) Patent No.: US 11,683,998 B2
(45) Date of Patent: Jun. 20, 2023

(54) VERTICAL PHASE CHANGE BRIDGE MEMORY CELL

(71) Applicant: International Business Machines Corporation, Armonk, NY (US)

(72) Inventors: Juntao Li, Cohoes, NY (US); Kangguo Cheng, Schenectady, NY (US); Carl Radens, LaGrangeville, NY (US); Ruilong Xie, Niskayuna, NY (US)

(73) Assignee: International Business Machines Corporation, Armonk, NY (US)

( * ) Notice: Subject to any disclaimer, the term of this patent is extended or adjusted under 35 U.S.C. 154(b) by 81 days.

(21) Appl. No.: 17/207,798

(22) Filed: Mar. 22, 2021

(65) Prior Publication Data

US 2022/0302377 A1   Sep. 22, 2022

(51) Int. Cl.
*H10N 70/20* (2023.01)
*H10B 63/00* (2023.01)
*H10N 70/00* (2023.01)

(52) U.S. Cl.
CPC ........... *H10N 70/231* (2023.02); *H10B 63/82* (2023.02); *H10B 63/84* (2023.02); *H10N 70/021* (2023.02); *H10N 70/063* (2023.02); *H10N 70/068* (2023.02); *H10N 70/8265* (2023.02); *H10N 70/841* (2023.02)

(58) Field of Classification Search
CPC ........................................................ H01L 45/06
See application file for complete search history.

(56) References Cited

U.S. PATENT DOCUMENTS

| | | | |
|---|---|---|---|
| 7,038,231 B2 | 5/2006 | Hart | |
| 7,608,848 B2 | 10/2009 | Ho | |
| 7,635,855 B2 | 12/2009 | Chen | |
| 7,688,619 B2 | 3/2010 | Lung | |
| 7,820,997 B2 | 10/2010 | Lai | |
| 7,884,342 B2 | 2/2011 | Lung | |
| 7,973,384 B2 | 7/2011 | Happ | |
| 8,610,098 B2 | 12/2013 | Lung | |
| 11,527,714 B2* | 12/2022 | Mo | H01L 45/1253 |
| 2011/0291064 A1* | 12/2011 | Marsh | H01L 45/06 257/E45.001 |

* cited by examiner

*Primary Examiner* — Mounir S Amer
(74) *Attorney, Agent, or Firm* — Edward J. Wixted, III

(57) ABSTRACT

A semiconductor structure for a vertical phase change memory cell that includes a bottom electrode on a portion of a semiconductor substrate and a pair of vertical phase change bridge elements that are each on a portion of the bottom electrode. The semiconductor structure for the vertical phase change memory cell includes a dielectric material separating the pair of vertical phase change bridge elements and a top electrode over the pair of vertical phase change bridge elements.

16 Claims, 14 Drawing Sheets

VERTICAL PHASE CHANGE BRIDGE MEMORY CELL

BACKGROUND OF THE INVENTION

The present invention relates generally to the field of semiconductor device technology and more particularly to an embedded heater in a phase change material in semiconductor chip applications including phase change memory devices.

Phase change materials include various chalcogenide glass materials that can be used in semiconductor device applications, such as phase change random access memory (PCRAM), which may also be known as PRAM, PCM, or PCME devices. A phase change material in a PCRAM typically has at least two solid phases, a crystalline state and an amorphous state. The transformation between these two phases can be achieved by changing the temperature of the phase change material. Typically, the transformation of the phase change material can be induced by heating through optical pulses or electrical or Joule heating.

The optical and electronic properties can vary significantly between the amorphous and crystalline phases of the phase change material. In typical memory applications, switching from the high-resistance or "reset" state, where part or all of the phase change material is amorphous, occurs when a current pulse is applied that heats the amorphous material above the crystallization temperature for a sufficiently long time for the material to crystallize. The switch occurs because the threshold switching effect leads to a drastic and sudden (within nanoseconds) reduction of the resistance of the amorphous phase when a certain threshold field is surpassed, at a given threshold voltage. Switching from the low-resistance or "set" state, where the phase change material is crystalline, is achieved by a high current pulse with a very short trailing edge. In typical PCM semiconductor applications, the current pulse heats the material by Joule heating, melts it, and enables very fast cooling (melt-quenching) such that the phase change material solidifies in the amorphous state. Since a phase change material permits reversible phase transformation in a typical case of a PCRAM device, the memory bit status can be distinguished by determining the state of phase change material in the memory bit.

SUMMARY

Embodiments of the present invention provide a semiconductor structure for a vertical phase change memory cell that includes a bottom electrode on a portion of a semiconductor substrate and a pair of vertical phase change bridge elements that are each on a portion of the bottom electrode. The vertical phase change memory cell includes a dielectric material separating the pair of vertical phase change bridge elements and a top electrode over the pair of vertical phase change bridge elements.

Embodiments of the present invention provide a method to form the vertical phase change memory cell that includes forming a stack of materials on a portion of a bottom electrode, wherein the stack of materials includes a layer of a first electrode extension material on the portion of the bottom electrode, a sacrificial material on the first electrode extension material, a second electrode extension material on the first electrode extension material, and a hardmask material on the second electrode extension material and selectively etching the stack of materials. The method includes depositing a layer of a phase change material over the hardmask material and exposed portions of the bottom electrode and recessing the layer of the phase change material above a bottom surface of the hardmask material. The method includes forming a first spacer around exposed portions of the layer of the hardmask material and selectively removing exposed portions of the layer of the phase change material not under the first spacer. The method includes forming a second spacer on outside surfaces of the first spacer and on two vertical layers of the phase change material remaining after the selective etch of the phase change material. Additionally, the method includes selectively etching a portion of the stack of materials and the first spacer and the second spacer surrounding the stack of materials and depositing a layer of an interlevel dielectric on exposed surfaces of the bottom electrode, the hardmask, the first spacer and the second spacer. The method includes performing a chemical mechanical polish stopping on a top surface of the hardmask material and, then, removing the hardmask material. Furthermore, the method includes forming a third spacer on exposed surfaces of the first spacer and on a top exposed portion of the second electrode extension and selectively etching exposed surfaces of the second electrode extension, the sacrificial material, and the first electrode extension. The method includes depositing a dielectric material over the exposed surfaces of the bottom electrode, the first electrode extension, a center exposed portion of the two vertical layers of the phase change material, the second electrode extension, the third spacer, the first spacer, the second spacer, and an interlevel dielectric material and then, selectively removing a portion of the dielectric material to a level below the top surface of the second dielectric and a bottom surface of the second electrode extension. The method includes forming a top electrode over a top exposed portion of the two vertical layers of the phase change material, over the top exposed portion of the second electrode extension and over the dielectric material.

BRIEF DESCRIPTION OF THE DRAWINGS

The aspects, features, and advantages of various embodiments of the present invention will be more apparent from the following description taken in conjunction with the accompanying drawings.

DETAILED DESCRIPTION

Figure 1:
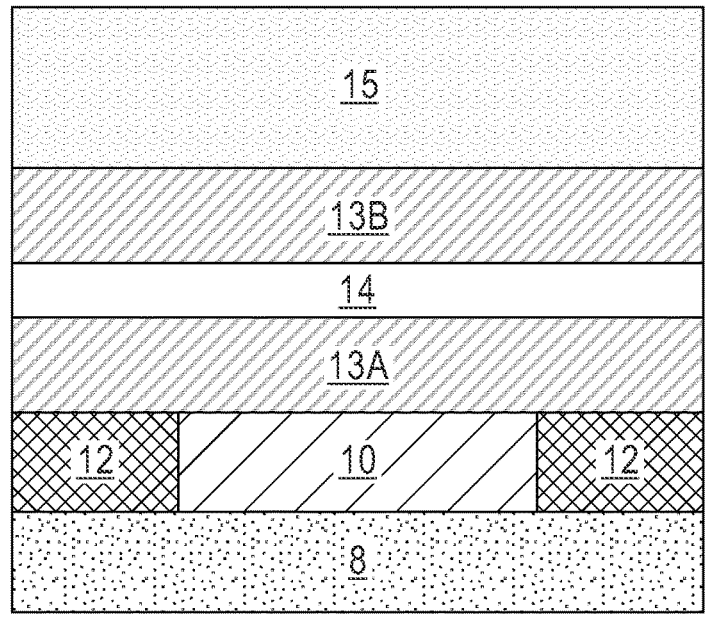
FIG. 1 is a cross-sectional view of a semiconductor structure of a stack of materials on a bottom electrode in accordance with an embodiment of the present invention.

Embodiments of the present invention recognize that phase change memory (PCM) has emerged as a viable next-generation non-volatile solid-state memory for semiconductor chip applications. Embodiments of the present invention recognize that a phase change bridge device is an option for a new PCM cell design. Embodiments of the present invention recognize that the phase change bridge device includes a narrow line of a thin horizontal layer of phase change material bridging two large electrodes.

Embodiments of the present invention recognize that during SET and RESET operation in the current phase change bridge device using a thin horizontal layer of phase change material between two large electrodes, the crystallization and the amorphization of the phase change material occurs randomly within the layer of phase change material forming the bridge between the two large electrodes. The random crystallization and amorphization of the layer of the phase change material results in variations in the memory device performance. Embodiments of the present invention recognize that new memory device designs and new memory device structures are needed to provide consistent and controllable changes in the atomic structure of the phase change material in the PCM cell of a phase change bridge device.

Embodiments of the present invention provide a novel vertical phase change bridge memory cell structure and a method of forming the vertical phase change bridge memory cell structure. Embodiments of the present invention provide the vertical phase change bridge memory cell structure where the switching can be localized within a thin vertical segment of phase change material bridging two separated metal layers or electrode extensions where each metal layer of the two metal layers connects to either a bottom or a top electrode and where the thin vertical segment of the phase change material connects to both the bottom and top electrode.

Embodiments of the present invention provide a pair of vertical phase change bridge elements with two thin vertical segments of the phase change material on opposite sides of a dielectric material. The pair of vertical phase change bridge elements are formed simultaneously using self-aligned semiconductor processes.

Embodiments of the present invention provide a pair of vertical phase change bridge elements separated by the dielectric material and joined to a top electrode and a bottom form a vertical PCM cell or a vertical bridge PCM cell. The two thin vertical segments of the phase change material connect to a portion of the bottom electrode, abut a top electrode, abut two upper top electrode extensions that are under a portion of the top electrode and abut two lower electrode extensions that are on a portion of the bottom electrode. The dielectric material separates the two vertical layers of the phase change material and the electrode extensions on each of the two vertical layers of the phase change material. Additionally, the dielectric material separates the upper electrode extension on one vertical layer of the phase change material from the lower electrode extension that is also on the vertical layer of the phase change material. The pair of vertical phase change bridge elements are formed using self-aligned processes. Embodiments of the present invention provide a method to create the pair of vertical phase change bridge elements to form a vertical PCM cell.

Embodiments of the present invention also provide a semiconductor structure for a second vertical PCM cell and a method for forming the second vertical PCM cell or vertical bridge PCM cell. The second vertical PCM cell provides two vertical phase change bridge elements separated by a dielectric material and formed with similar processes as the vertical PCM cell using two vertical phase change bridge elements but in the second vertical PCM cell structure only one of the two vertical phase change bridge elements connects to a top electrode and to a bottom electrode to form the second vertical PCM cell structure. Embodiments of the present invention provide a method of forming a vertical PCM cell using a single vertical phase change bridge element of the two vertical phase change bridge elements formed simultaneously using self-aligned semiconductor processes. In the second vertical PCM cell, a single top electrode connects to the bottom electrode using either the right vertical phase change bridge element on the right side of the semiconductor structure or the left vertical phase change bridge element on the left side of the semiconductor structure. The right side vertical phase change bridge element and the left side vertical phase change bridge element are separated by the dielectric material.

Detailed embodiments of the claimed structures and methods are disclosed herein. The method described below does not form a complete process flow for manufacturing integrated circuits, such as, semiconductor devices. The present embodiments can be practiced in conjunction with the integrated circuit fabrication techniques currently used in the art, for semiconductor devices, and only so much of the commonly practiced process steps are included as are necessary for an understanding of the described embodiments. The figures represent cross-section portions of one or more vertical phase change memory (PCM) devices in a semiconductor chip. The figures are not drawn to scale, but instead are drawn to illustrate the features of the described embodiments. Specific structural and functional details disclosed herein are not to be interpreted as limiting, but merely as a representative basis for teaching one skilled in the art to variously employ the methods and structures of the present disclosure. In the description, details of well-known features and techniques may be omitted to avoid unnecessarily obscuring the presented embodiments.

References in the specification to "one embodiment", "other embodiment", "another embodiment", "an embodiment", etc., indicate that the embodiment described may include a particular feature, structure or characteristic, but every embodiment may not necessarily include the particular feature, structure or characteristic. Moreover, such phrases are not necessarily referring to the same embodiment. Further, when a particular feature, structure, or characteristic is described in connection with an embodiment, it is understood that it is within the knowledge of one skilled in the art to affect such feature, structure or characteristic in connection with other embodiments whether or not explicitly described.

For purposes of the description hereinafter, the terms "upper", "lower", "right", "left", "vertical", "horizontal", "top", "bottom", and derivatives thereof shall relate to the disclosed structures and methods, as oriented in the drawing figures. The terms "overlying", "atop", "over", "on", "positioned on" or "positioned atop" mean that a first element is present on a second element wherein intervening elements, such as an interface structure, may be present between the first element and the second element. The term "direct contact" means that a first element and a second element are connected without any intermediary conducting, insulating or semiconductor layers at the interface of the two elements.

In the interest of not obscuring the presentation of the embodiments of the present invention, in the following detailed description, some of the processing steps, materials, or operations that are known in the art may have been combined together for presentation and for illustration purposes and in some instances may not have been described in detail. Additionally, for brevity and maintaining a focus on distinctive features of elements of the present invention, description of previously discussed materials, processes, and structures may not be repeated with regard to subsequent Figures. In other instances, some processing steps or operations that are known may not be described. It should be understood that the following description is rather focused on the distinctive features or elements of the various embodiments of the present invention.

FIG. 1 is a cross-sectional view of semiconductor structure 100 of a stack of materials on bottom electrode 10 in accordance with an embodiment of the present invention. As depicted, FIG. 1 includes bottom electrode 10 on a portion of semiconductor substrate 8, interlevel dielectric (ILD) 12 on a portion of semiconductor substrate 8, a layer of material for electrode extension 13A, sacrificial layer 14, a layer of material for electrode extension 13B, and hardmask (HM) 15. Bottom electrode 10 residing on semiconductor substrate 8 can be surrounded by ILD 12 on the sides of bottom electrode 10 and covered by a portion of the layer of electrode extension 13A.

Semiconductor substrate 8 may be composed of any semiconductor material. For example, semiconductor substrate 8 may be formed with any type of semiconductor substrate or wafer including but, not limited to silicon, silicon germanium, a group IV semiconductor material, a group III-V semiconductor material, a group II-VI semiconductor material, a silicon on insulator (SOI), or other known semiconductor material used in semiconductor chips. In various embodiment, semiconductor substrate 8 includes one or more semiconductor devices, such as transistors, isolation trenches, contacts, and the like. In some embodiments, bottom electrode 10 resides on a semiconductor device or a contact in semiconductor substrate 8. In some embodiments, bottom electrode 10 connects to a contact (not shown) which extends through an inter-layer dielectric (not shown) to underlying access circuitry or transistors in substrate 8 (not shown).

Bottom electrode 10 may be formed of any conductive material used in semiconductor chip electrodes. In various embodiments, bottom electrode 10 has a rectangular shape. Bottom electrode 10 can have numerous lengths, widths and shapes. For example, bottom electrode 10 may have a narrower width going into the drawing paper and a longer length extending into and out of the drawing paper. After forming the opening within ILD 12, the bottom electrode 10 is formed by deposition of a conductive metallic material into the opening in ILD 12. The conductive metallic material that provides the bottom electrode 10 may include, but is not limited to, copper (Cu), titanium nitride (TiN), tungsten (W), tungsten nitride (WN), tungsten carbide (WC), silver (Ag), gold (Au), aluminum (Al) or multilayered stacks thereof. The conductive metallic material may be formed by a deposition process such as, for example, chemical vapor deposition (CVD), physical vapor deposition (PVD), plasma enhanced CVD (PECVD), sputtering, atomic layer deposition (ALD) or plating. A planarization process or an etch back process may follow the deposition of the conductive metallic material that provides the bottom electrode 10. As is shown, the bottom electrode 10 has a top surface that is coplanar with the top surface of ILD 12. In some embodiments, bottom electrode 10 is smaller or larger. In embodiment, bottom electrode 10 is completely covered by the vertical phase change bridge elements (e.g., ILD 12 is not over a portion of bottom electrode 10.

A first layer of an electrode extension material that forms electrode extension 13A resides on bottom electrode 10 and on ILD 12. The material for electrode extensions 13A and 13B can be any conductive material commonly used for a conductive electrode in a PCM device. For example, each of electrode extensions 13A and 13B can be titanium nitride (TiN) or other similar conductive material. The thickness of electrode extensions 13A and 13B can range from 20 nm to 50 nm but, is not limited to these thicknesses. In various embodiments, the thickness of electrode extensions 13A and 13B is the same. In one embodiment, electrode extension 13B has a different thickness than electrode extension 13A. A layer of a hardmask material, such as SiN or another known hardmask material resides on electrode extension 13B. As depicted, HM 15 resides on the top of semiconductor structure 100.

Sacrificial layer 14 resides on electrode extension 13A and is covered by electrode extension 13B. Sacrificial layer 14 may be composed of a dielectric material, such as, but not limited to silicon dioxide ($SiO_2$). The thickness of sacrificial layer 14 can range from 10 nm to 50 nm but, is not limited to these thicknesses. In some cases, sacrificial layer 14 may be greater than 50 nm. In some cases, s sacrificial layer 14 may be greater than 5 nm but less than 10 nm.

Figure 2:
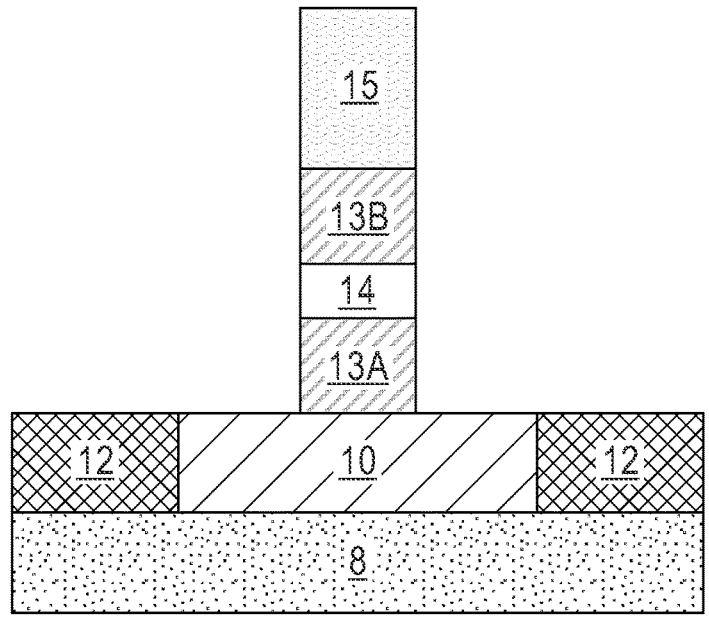
FIG. 2 is a cross-sectional view of the semiconductor structure after etching portions of the stack of materials on the bottom electrode in accordance with an embodiment of the present invention.

FIG. 2 is a cross-sectional view of semiconductor structure 200 after etching portions of the stack of materials on bottom electrode 10 in accordance with an embodiment of the present invention. After patterning the top surface of HM 15, for example, using photolithography, an etch process removes portions of the stack of materials including the layers of electrode extensions 13A and 13B, sacrificial layer 14, and HM 15 from a portion of bottom electrode 10. For example, a reactive ion etch (RIE) process selectively removes portions of the layers of electrode extensions 3A and 13B, sacrificial layer 14, and HM 15 to expose top surface of ILD 12 and portions of bottom electrode 10. As depicted in FIG. 2, after completing the RIE, a vertical portion of the stack of electrode extension 13A, sacrificial layer 14, electrode extension 13B, and HM 15 remain and cover a portion of bottom electrode 10. As depicted, the RIE exposes ILD 12 and some portions of the top surface of bottom electrode 10.

Figure 3:
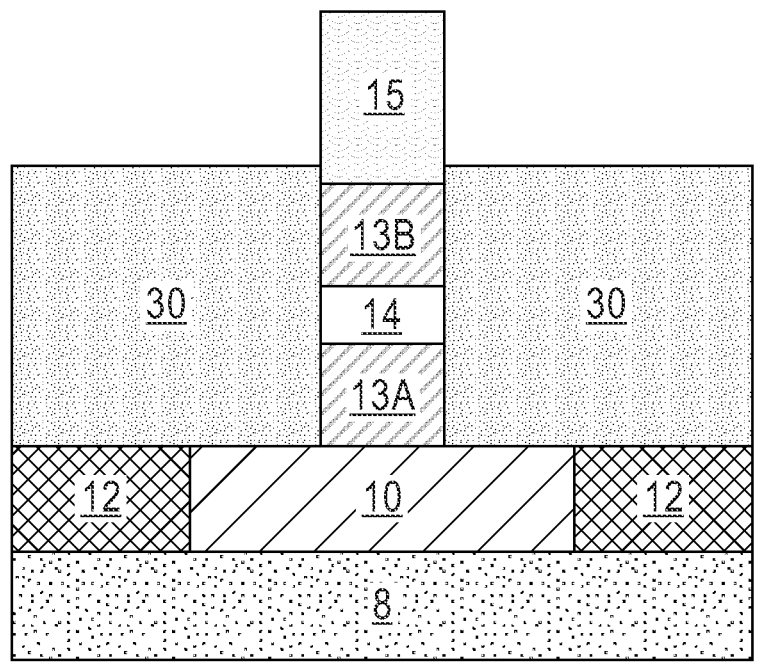
FIG. 3 is a cross-sectional view of the semiconductor structure after depositing a layer of a phase change material around the remaining stack of materials and recessing the phase change material in accordance with an embodiment of the present invention.

FIG. 3 is a cross-sectional view of semiconductor structure 300 after depositing a layer of a phase change material, such as PC 30 around the remaining vertical portion of the stack of materials and recessing PC 30 in accordance with an embodiment of the present invention. As depicted, FIG. 3 includes semiconductor substrate 8, bottom electrode 10, ILD 12, electrode extensions 13A and 13B, sacrificial layer 14, HM 15, and PC 30. PC 30 can reside on ILD 12 and a portion of bottom electrode 10 and is recessed or etched after deposition. As depicted, PC 30 surrounds the remaining vertical portion of the stack of the layers of electrode extensions 13A and 13B, sacrificial layer 14, and a bottom portion of HM 15 after recessing PC 30.

A layer of a phase change material (i.e., PC 30) may be composed of germanium-antimony-tellurium (GeSbTe also known as GST) or a germanium-tellurium compound material (GeTe), that is deposited over the exposed surfaces of ILD 12, bottom electrode 10, and HM 15. Alternatively, other suitable materials for PC 30 include Si—Sb—Te (silicon-antimony-tellurium) alloys, Ga—Sb—Te (gallium-antimony-tellurium) alloys, Ge—Bi—Te (germanium-bismuth-tellurium) alloys, In—Se (indium-tellurium) alloys, As—Sb—Te (arsenic-antimony-tellurium) alloys, Ag—In—Sb—Te (silver-indium-antimony-tellurium) alloys, Ge—In—Sb—Te alloys, Ge—Sb alloys, Sb—Te alloys, Si—Sb alloys, Ge—Te alloys and combinations thereof. PC 30 may be undoped or doped (e.g., doped with one or more of O, N, Si, or Ti).

A chemical mechanical polish (CMP) can be performed on the top surface of PC 30 after deposition and an etch, such as a wet etch or dry etch, can be performed to recess the top surface of PC 30 below the top surface of HM 13. After recessing PC 30, a bottom portion of HM 15 may remain surrounded by PC 30.

In an alternative process not depicted in FIG. 3, a conformal deposition of a layer of phase change material PC 30 occurs depositing PC 30 over the exposed surfaces of ILD 12, bottom electrode 10, electrode extensions 13A and 13B, sacrificial layer 14, and HM 15. In this case, a relatively thin layer of PC 30 is deposited.

Figure 4:
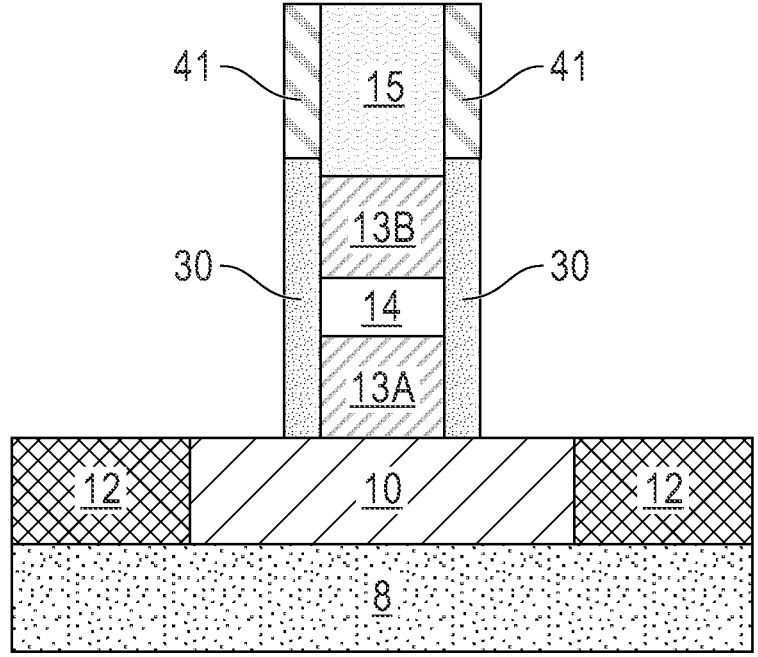
FIG. 4 is a cross-sectional view of the semiconductor structure after forming a spacer over the hardmask and performing a directional etch of the phase change material in accordance with an embodiment of the present invention.

FIG. 4 is a cross-sectional view of semiconductor structure 400 after forming spacer 41 over HM 15 and performing an etch of PC 30 in accordance with an embodiment of the present invention. As depicted, FIG. 4 includes semiconductor substrate 8, bottom electrode 10, ILD 12, electrode extensions 13A and 13B, sacrificial layer 14, HM 15, spacer 41, and a remaining portion of PC 30 under spacer 41.

Using known methods of sidewall spacer formation, a thin, conformal layer of a dielectric material, such as SiOC (a dielectric material containing elements silicon (Si), oxygen (O), and carbon (C)), for spacer 41 can be deposited, for example, using thin film deposition processes, such as atomic layer deposition (ALD), which is selectively etched, for example with RIE, to form spacer 41 surrounding portions of the sides of HM 15 above the top surface of PC 30. The thickness or width of spacer 41 can range from 10 nm to 50 nm but, is not limited to these thicknesses. Using a controllable, conformal deposition process, such as atomic layer deposition, a very thin layer of dielectric material can be deposited to form a thin, spacer 41.

Using spacer 41 and HM 15 as etch masks, a directional or isotropic etch, such as RIE, can be performed on the exposed horizontal surfaces of PC 30. After etching, a thin vertical portion or slice of PC 30 remains around the vertical sides of electrode extensions 13A and 13B, sacrificial layer 14, and a bottom portion of HM 15. In this case, a horizontal thickness of the two remaining thin vertical layers or remaining portions of PC 30 is the same as or slightly less than a horizontal thickness of spacer 41 after removing spacer 41 and exposed portions of PC 30 not under spacer 41. The horizontal thickness of spacer 41 can be determined by the conformal, thin film deposition process used in the formation of spacer 41.

In an alternative process when the thin conformal coat or layer of PC 30 deposited using a conformal deposition rather a deposition of a thick layer of PC 30, semiconductor structure 400 may be formed by depositing an optical planarizing layer (OPL) over the exposed surfaces extending to a level above the bottom of HM 15. Removing the exposed portions of PC 30 above the OPL can occur. Spacer 41 can be formed by depositing a thin layer of spacer material, for example using ALD and performing an RIE to remove the deposited spacer material from horizontal surfaces of PC 30 and HM 15 to form semiconductor structure 400.

Figure 5:
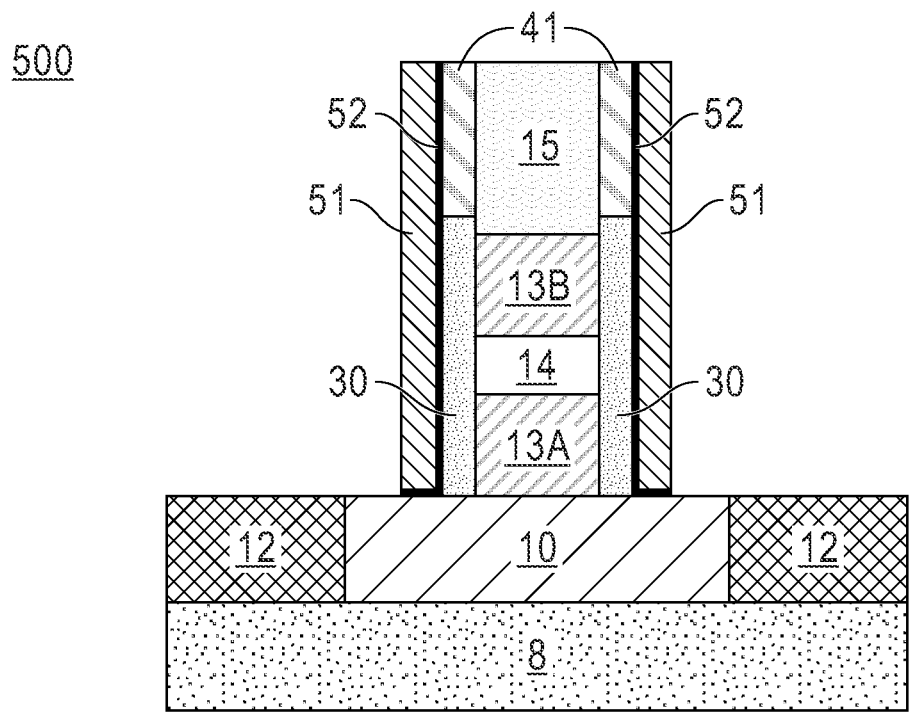
FIG. 5 is a cross-sectional view of the semiconductor structure after depositing a resistive liner and forming a second spacer in accordance with an embodiment of the present invention.

FIG. 5 is a cross-sectional view of semiconductor structure 500 after depositing resistive liner 52 and forming spacer 51 in accordance with an embodiment of the present invention. As depicted, FIG. 5 includes the elements of FIG. 4 and resistive liner 52 and spacer 51.

Resistive liner 52 can be formed by a thin conformal layer of a higher resistivity material than the phase change material in PC 30, such as but not limited to, tantalum nitride (TaN). Resistive liner 52 can also be comprised of a conductive material such as, for example, aluminum nitride (AlN), boron nitride (BN), aluminum oxide (AlO), TaN, TiN, W, tungsten nitride (WN), cobalt tungsten (CoW), nickel tungsten (NiW), yttrium oxide (YO), or alloys of these materials. The resistance of the resistive liner is substantially greater than the resistance of the PCM material in low resistance state (e.g., ten to forty times higher, or about twenty times higher) and substantially lower than the resistance of the PCM material in high resistance state (e.g., five to fifty times lower, or about ten times lower). Resistive liner 52 is an optional layer in semiconductor structure 400. For example, resistive liner 52 can be deposited a couple nanometers to ten nanometers thick in order to improve electrical function, such as mitigating resistance drift in the completed device. In some embodiments, resistive liner 52 is not present. In some embodiments, a thickness of resistive liner 52 can range from 2 nm to 8 nm but, is not limited to these thicknesses.

In various embodiments, spacer 51 can be formed over resistive liner 52 using known sidewall spacer formation processes. For example, spacer 51 can be formed with a conformal deposition of a second spacer material, such as but, not limited to SiN, over the exposed surfaces of ILD 12, bottom electrode 10 and resistive liner 52 followed by an RIE to form spacer 51. For later processing (e.g., providing a selective etch of different spacer materials), spacer 51 can be composed of a different dielectric spacer material than spacer 41. The directional RIE removes exposed horizontal portions of resistive liner 52 and spacer 51 from horizontal surfaces of semiconductor structure 500.

As depicted in FIG. 5, the top horizontal surfaces of ILD 12 and a portion of the top surface of bottom electrode 10 are exposed (e.g., not covered by PC 30, electrode extension 13A, spacer 51 or resistive liner 52). In an embodiment, when resistive liner 52 is not present, spacer 51 is formed on the vertical sides of spacer 41 and PC 30. In some embodiments, a thickness of spacer 51 can range from 5 nm to 50 nm but, is not limited to these thicknesses.

Figure 6A:
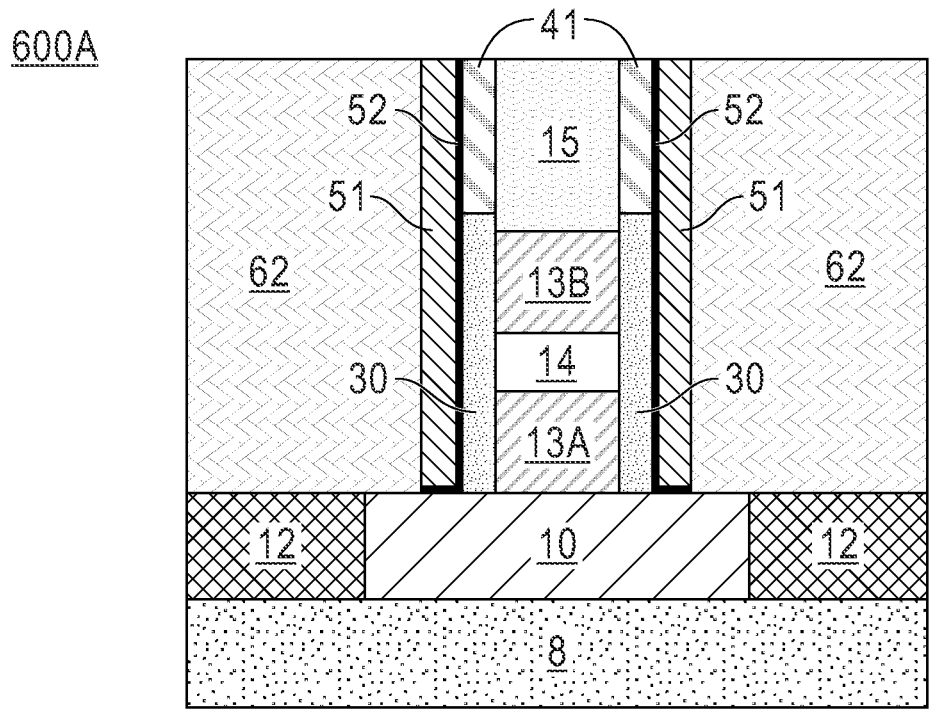
FIG. 6A is a cross-sectional view of the semiconductor structure after selectively etching a portion of the stack of materials and depositing a second interlevel dielectric in accordance with an embodiment of the present invention.
Figure 6B:
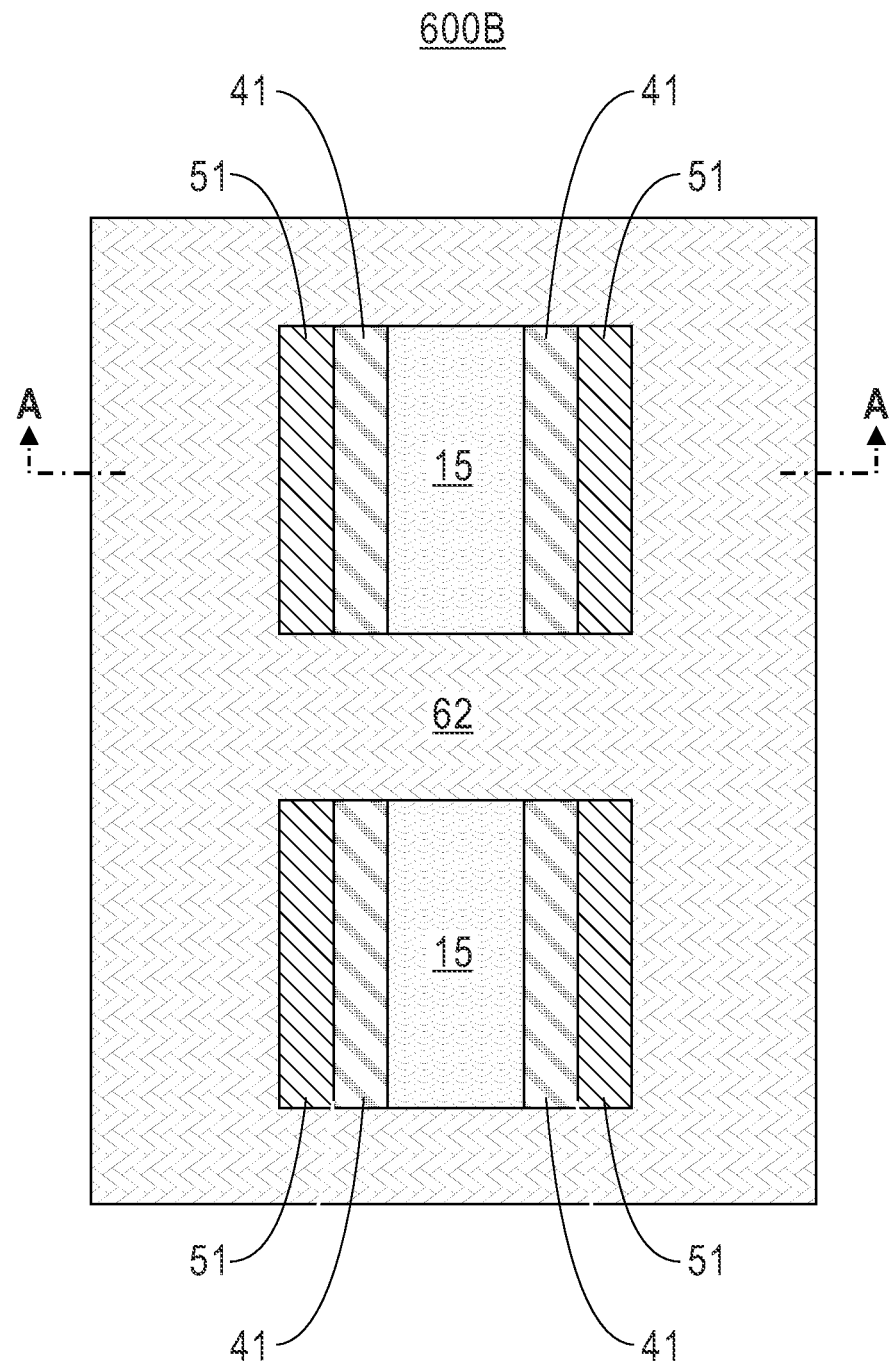
FIG. 6B is a top view of the semiconductor structure selectively etching a portion of the stack of materials and after depositing the second interlevel dielectric in accordance with an embodiment of the present invention.

FIG. 6A is a cross-sectional view of semiconductor structure 600A after selectively etching a portion of the stack of materials and depositing ILD 62 in accordance with an embodiment of the present invention. FIG. 6A is a cross-section through A-A (a location of cross-section A-A is depicted in FIG. 6B) after selectively etching a portion of the stack of materials and depositing a layer of ILD 62. The selective etching of the portion of the stack of materials is not depicted in FIG. 6A but, is depicted in FIG. 6B which is a top view of the semiconductor structure. As depicted, FIG. 6A includes the elements of FIG. 5 and ILD 62. After selectively etching the stack of materials, using known deposition processes, ILD 62 is deposited covering the exposed top surfaces of HM 15, spacer 41, resistive liner 52, spacer 51, bottom electrode 10, and ILD 12.

A chemical mechanical polish (CMP) occurs, removing excess ILD 62 above spacer 51, spacer 41, and HM 15 using the top of HM 15 as CMP stop. After CMP, ILD 62 resides on ILD 12 and portions of bottom electrode 10 abutting spacer 51. Each resistive liner 52 abuts spacer 51 on outside surfaces and the inner surfaces of each of the pair of resistive liner 52 abuts spacer 41 on a top portion of each resistive liner 52 and abuts PC 30 on a bottom inner portion of each resistive liner 52. The remaining portions of electrode extension 13A, sacrificial layer 14, and electrode extension 13B that are under HM 15 each abut vertical sides of each of the vertical segments or portions of PC 30 on each of the pair of resistive liner 52. The two vertical segments of PC 30 on bottom electrode 10 may be covered on the outside surfaces by resistive liner 52, by electrode extensions 13A and 13B, sacrificial layer 14, and a portion of HM 15 on interior surfaces, and topped by spacer 41.

FIG. 6B is a top view of semiconductor structure 600B after selectively etching a portion of the stack of materials and depositing ILD 62 in accordance with an embodiment of the present invention. As depicted, FIG. 6B is a top view of semiconductor structure 600B selectively removing portions of the stack of materials, depositing ILD 62 and performing a CMP. FIG. 6B includes a location of cross-section A-A and a view of the top surfaces of ILD 62, the remaining portions of spacer 51, spacer 41, and HM 15 after etching the stack of materials, after ILD deposit, and CMP. Used as a CMP stop, HM 15 can cover segments or remaining portions of the layers of: electrode extension 13A, sacrificial layer 14, and electrode extension 13BA in the stack of materials under HM 15 after the etch process removes portions of HM 15 and portions of electrode extensions 13A and 13B, and sacrificial layer 14. Resistive liner 52 (optional) is not depicted in FIG. 6B.

As previously discussed with reference to FIG. 6A, the stack of materials can be patterned, and portions of ILD 62 and portions of spacer 51, resistive liner 52 (optional, not depicted), spacer 41, selectively etched, and a layer of ILD 62 can be deposited over the semiconductor structure and excess portions of ILD 62 removed using a CMP After etching, portions of spacer 41, spacer 51, and HM 15 remain along with the stack of materials below HM 15 (e.g., portions of electrode extension 13A, sacrificial layer 14, electrode extension 13B under HM 15 not depicted). After etching, two opposite end portions of HM 15, spacer 51, and spacer 41 on the top and bottom edges of the segments of the stack of materials under HM 15 (not depicted) are exposed in the two portions of the stack of materials under HM 15 with the left and right sides of the stack of materials abutting spacer 41. Spacer 51 outside of spacer 41 remain covering the left and right edges of the two segments or portions of the stack of materials (e.g., electrode extensions 13A and 13B and sacrificial layer 14 not depicted) under HM 15 after etching.

While FIG. 6B depicts two sections of the remaining portions of spacer 51, spacer 41, and HM 15 that is over the portions of electrode extension 13A, sacrificial layer 14, and electrode extension 13B (not depicted), as known to one skilled in the art, any number of segments or portions of spacer 51, spacer 41, and HM 15 may be formed. For example, a line of four sections HM 15 surrounded by spacer 41 and spacer 51 could be formed in a line on bottom electrode 10. In other examples, a matrix, such as a two by two or a four by four matrix of segments of HM 15 over the portions of electrode extension 13A, sacrificial layer 14, and electrode extension 13B (not depicted) may be formed. The shape of each segment of the remaining spacer 51, spacer 41, and HM 15 may be different in other examples of the present invention and the shape of the each segment of the remaining spacer 51, spacer 41, and HM 15 can be different (e.g., one segment is longer and another segment is shorter, etc.). In other examples, a different number of sections of spacer 51 surrounding spacer 41 and HM 15 could be present on bottom electrode 10. In other examples, the size and shape of bottom electrode 10 on which each section resides may be different and the number of sections residing on bottom electrode 10 may be different.

Figure 7:
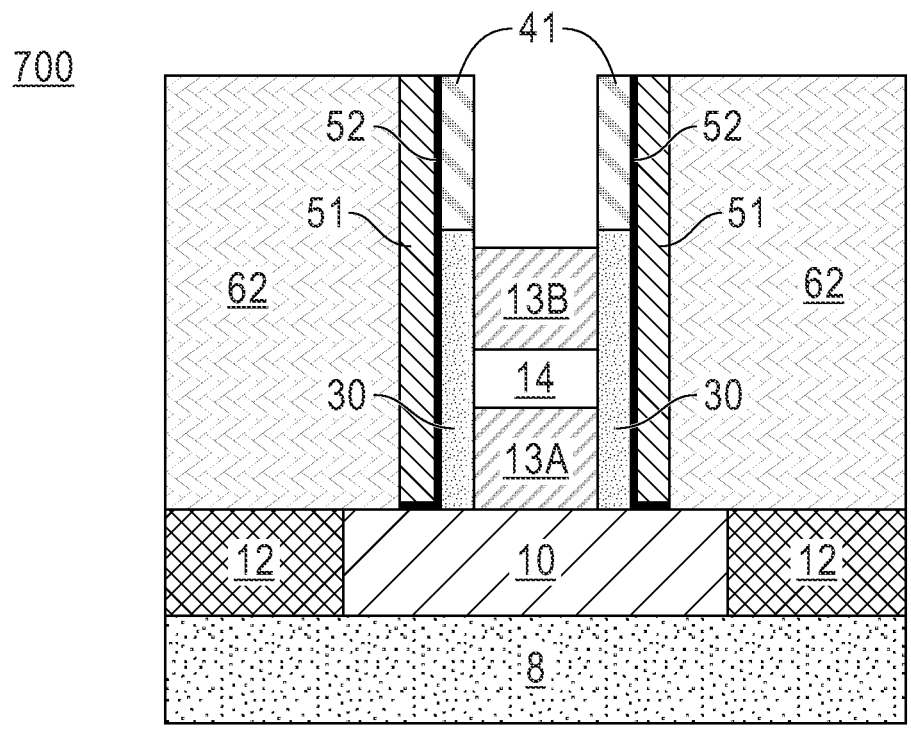
FIG. 7 is a cross-sectional view of the semiconductor structure after removing the hardmask layer in accordance with an embodiment of the present invention.

FIG. 7 is a cross-sectional view of semiconductor structure 700 after removing HM 15 in accordance with an embodiment of the present invention. As depicted, FIG. 7 includes the elements of FIG. 6A except for HM 15. Using known patterning and etch processes, HM 15 is removed from semiconductor structure 700 using a selective etch process. The etch of HM 15 stops at the top surface of the second layer of electrode extension 13B and exposes the vertical sides of spacer 41 and a top portion of the sides of PC 30.

Figure 8:
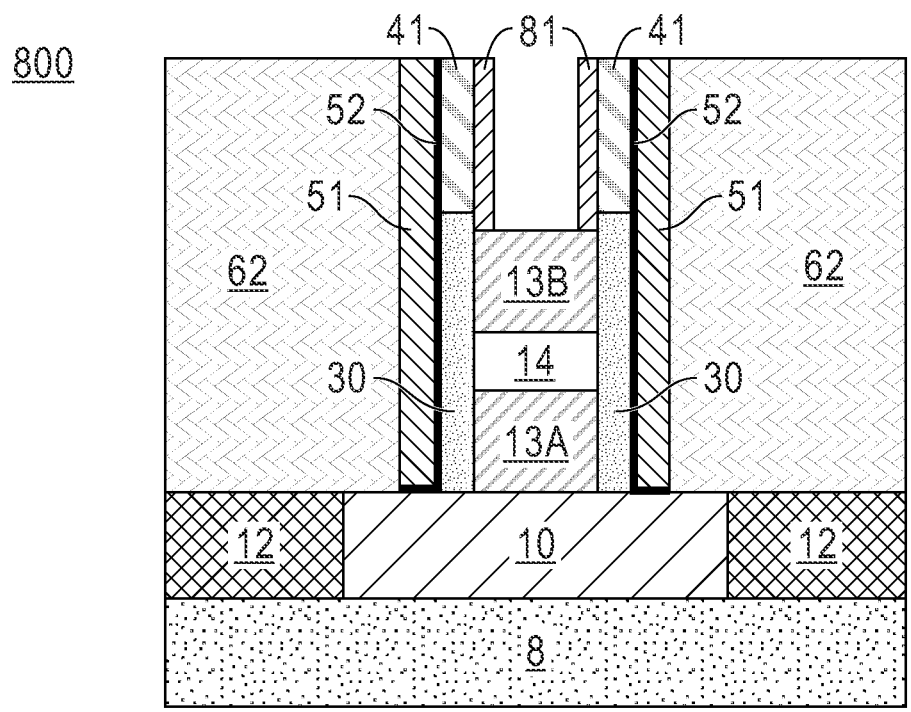
FIG. 8 is a cross-sectional view of the semiconductor structure after forming a third spacer in accordance with an embodiment of the present invention.

FIG. 8 is a cross-sectional view of semiconductor structure 800 after forming spacer 81 in accordance with an embodiment of the present invention. Using previously discussed known spacer formation processes (e.g., a conformal deposition and RIE), spacer 81 can be formed on the exposed vertical surfaces of spacer 41, PC 30, and on an exposed top portion of electrode extension 13B. In various embodiments, spacer 81 is composed of a different dielectric material than the dielectric materials used in spacer 41 and spacer 51. For example, spacer 81 may be composed of SiCN (e.g., a silicon carbon nitride material). In some embodiments, the thickness of spacer 81 can range from 10 nm to 30 nm but, is not limited to these thicknesses.

Figure 9:
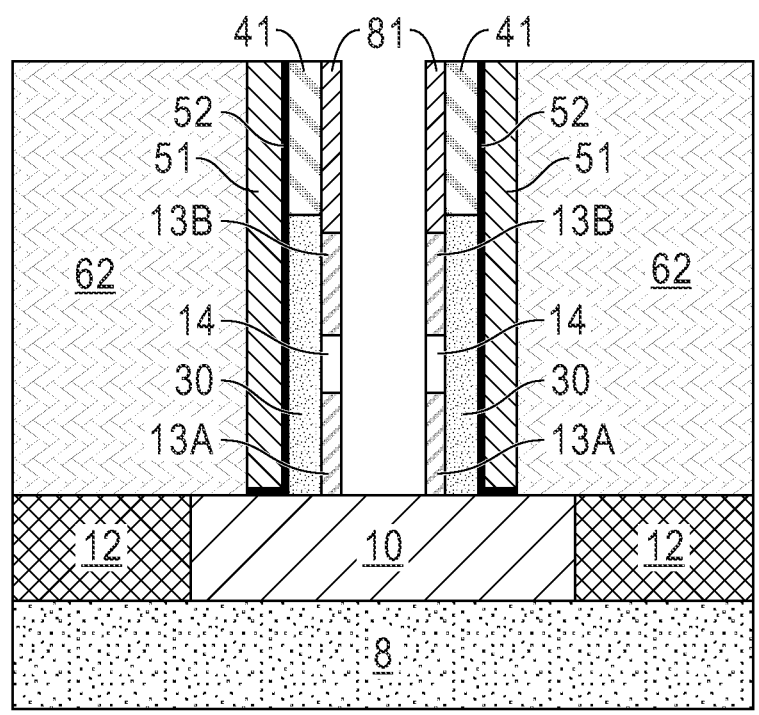
FIG. 9 is a cross-sectional view of the semiconductor structure after performing a directional etch to the top surface of the bottom electrode in accordance with an embodiment of the present invention.

FIG. 9 is a cross-sectional view of semiconductor structure 900 after performing a directional etch to the top surface of bottom electrode 10 in accordance with an embodiment of the present invention. After patterning the top surface of semiconductor structure 900, a selective, isotropic etch, for example, using RIE, removes electrode extension 13B, sacrificial layer 14, and electrode extension 13A, stopping at bottom electrode 10. The isotropic etch leaves spacer 81, the portion of electrode extension 13B, the portion of sacrificial layer 14, and the portion of electrode extension 13A under spacer 81, spacer 41 and the portion of PC 30 under spacer 41, resistive liner 52, spacer 51, and ILD 62 along with ILD 12 and bottom electrode 10 on semiconductor substrate 8. After etching, a cavity extends through a portion of semiconductor structure 900 to bottom electrode 10.

Figure 10:
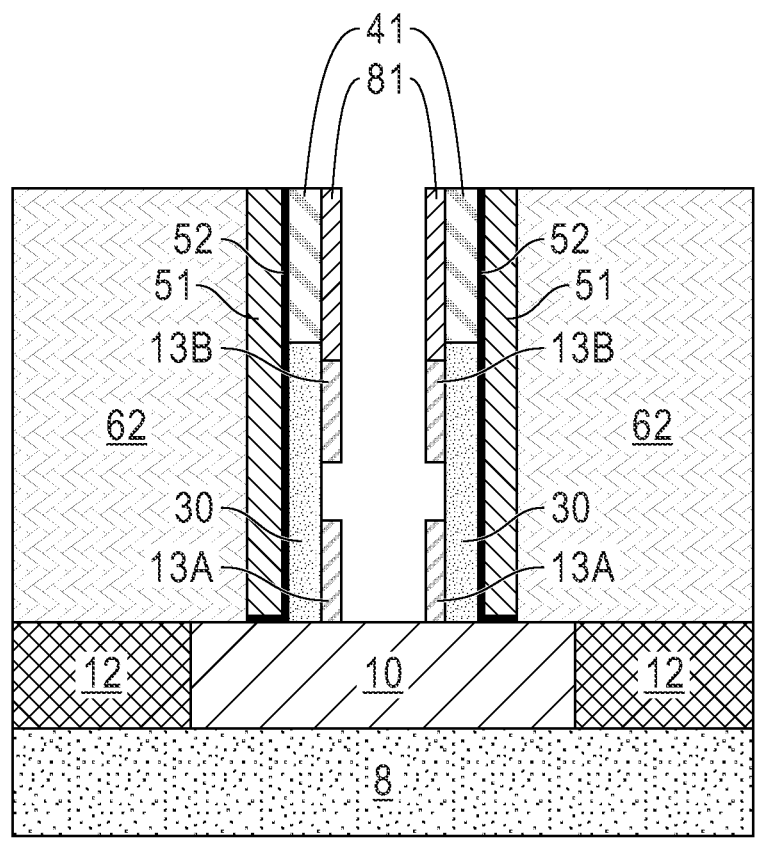
FIG. 10 is a cross-sectional view of the semiconductor structure after removing the remaining portions of the sacrificial layer in accordance with an embodiment of the present invention.

FIG. 10 is a cross-sectional view of semiconductor structure 1000 after removing the remaining portions of sacrificial layer 14 in accordance with an embodiment of the present invention. In various embodiments, a selective etch of sacrificial layer 14 occurs. For example, a wet etchant with a chemistry selected to remove sacrificial layer 14 without removing electrode extension 13A, electrode extension 13B, spacer 81, and bottom electrode 10 can remove the remaining portions of sacrificial layer 14 from a portion of the vertical sides of PC 30 in the cavity.

In one embodiment, the remaining portion of sacrificial layer 14 on the vertical sides of PC 30 is not removed. In this case, the material selected for sacrificial layer 14 has electrical and thermal properties required for the functioning of the completed PCM cells. For example, sacrificial layer 14 can a dielectric material, such as $SiO_2$ or other suitable dielectric materials when sacrificial layer 14 is not removed from semiconductor structure 1000.

Figure 11:
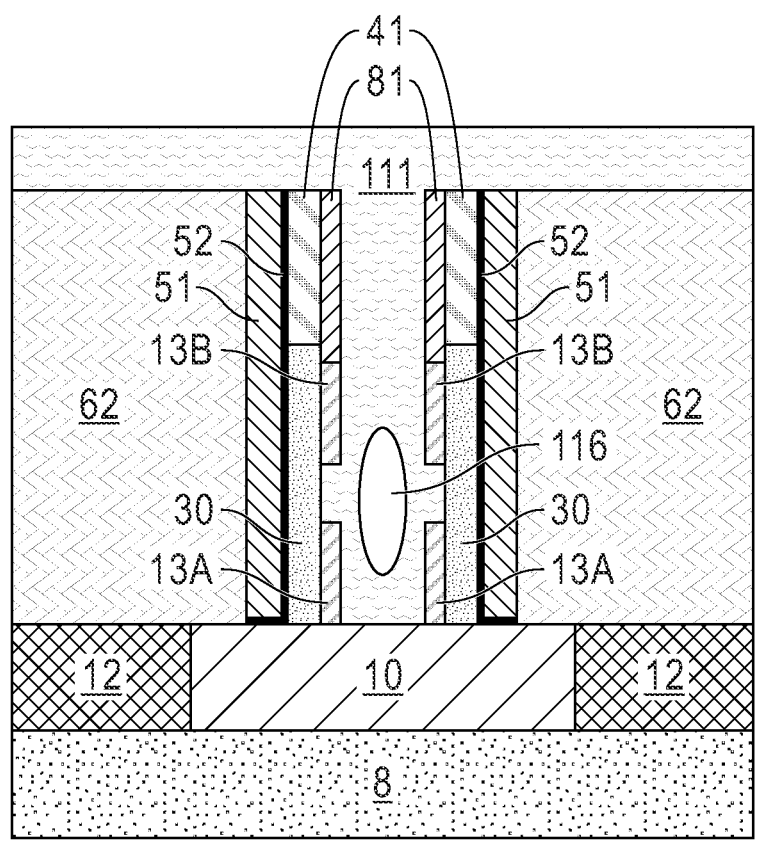
FIG. 11 is a cross-sectional view of the semiconductor structure after depositing a layer of a dielectric material over the semiconductor structure in accordance with an embodiment of the present invention.

FIG. 11 is a cross-sectional view of semiconductor structure 1100 after depositing dielectric 111 over semiconductor structure 1100 in accordance with an embodiment of the present invention. Using a non-conformal deposition process, such as chemical vapor deposition (CVD) or plasma vapor deposition (PVD), a layer of dielectric 111 is deposited on exposed surfaces of ILD 62, spacer 51, resistive liner 52, spacer 41, spacer 81, bottom electrode 10 and fills the cavity between the vertical sides of electrode extensions 13A and 13B, the exposed middle portion of PC 30, vertical sides between spacer 81, and covers bottom electrode 10 in the cavity. Dielectric 111 can be composed of a dielectric material, such as but, not limited to $SiO_2$, or low k dielectric material, such as silicon nitride (SiN), boron nitride (SiB), silicon oxynitride (SiON), SiBCN, SiOCN, SiCN, SiCO, or a combination thereof. In some embodiments, as depicted in FIG. 11, a space or void, such as void 116 that does not fill with dielectric 111 occurs. In these cases, void 116 can form in a central area between PC 30. When present, void 116 reduces thermal loss in the PCM cell structure (e.g., reduces thermal transfer as the air in void 116 provides less thermal energy transfer than dielectric 111). In some cases, the airgap forming void 116 can be approximately as wide as one half the distance between right and left vertical surfaces of PC 30. In other cases, void 116 may be larger, smaller, or not present (e.g., dielectric 111 completely fills the space between the vertical opposing sides of PC 30 and the vertical opposing sides of electrode extensions 13A and 13B).

Figure 12:
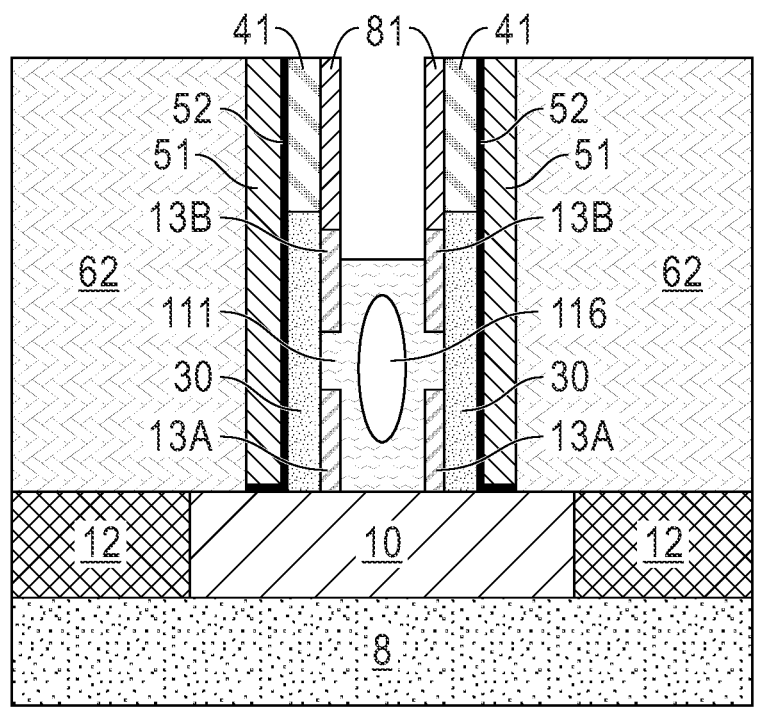
FIG. 12 is a cross-sectional view of the semiconductor structure after CMP and removing a portion of the dielectric material in accordance with an embodiment of the present invention.

FIG. 12 is a cross-sectional view of semiconductor structure 1200 after CMP and removing a portion of dielectric 111 in accordance with an embodiment of the present invention. As depicted, FIG. 12 includes the elements of FIG. 11 with the exception of portions of dielectric 111 that can be removed from the top surfaces of ILD 12, spacer 51, spacer 41, spacer 81, the vertical sides of spacer 81 and a portion of the vertical sides of electrode extension 13B. A CMP removes dielectric 111 from the top surfaces of ILD 62, spacer 51, spacer 41, and spacer 81 using the top surfaces of the spacers (e.g., 41, 51, and 81) to stop the CMP. After etching, a portion of dielectric 111 resides on a portion of bottom electrode 10, covering exposed surfaces of electrode extension 13A, sacrificial layer 14 and electrode extension 13B. In other examples, more or less of electrode extension 13B on PC 30 maybe exposed.

A selective wet or dry etch removes a portion of dielectric 111 remaining in the cavity below the top surface of spacer 81. For example, after patterning, an RIE removes dielectric 111 to a level below the bottom of spacer 81 exposing a portion of electrode extension 13B. A top portion of the two top portions of electrode extension 13B on each side of the cavity can be exposed. A portion of dielectric 111 remains on the vertical portions of electrode extension 13B and electrode extension 13A under spacer 81, on the exposed portion of the vertical sides of PC 30 under electrode extension 13B and spacer 81.

Figure 13:
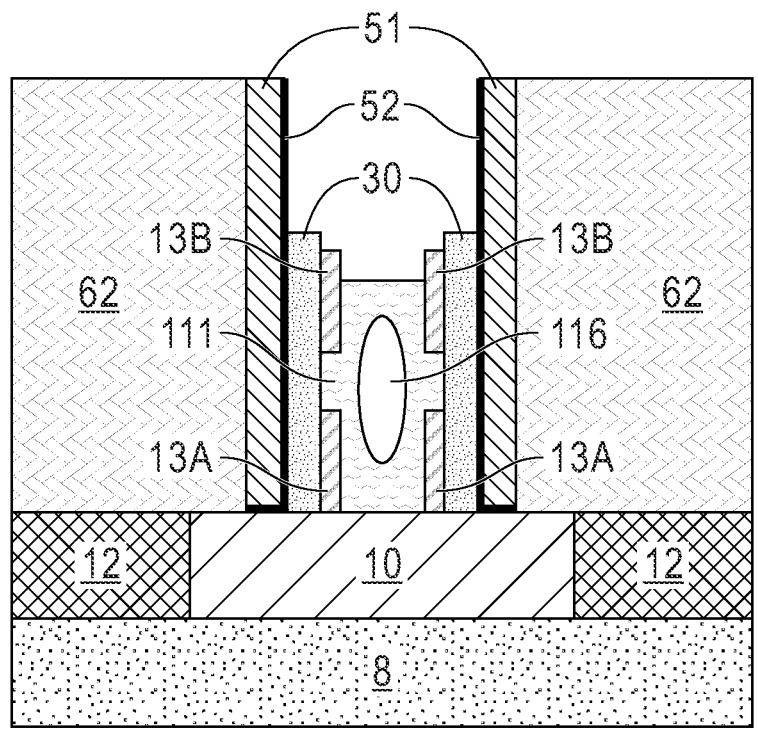
FIG. 13 is a cross-sectional view of the semiconductor structure after removing the two spacers in accordance with an embodiment of the present invention.

FIG. 13 is a cross-sectional view of semiconductor structure 1300 after removing spacer 41 and spacer 81 in accordance with an embodiment of the present invention. As depicted, FIG. 13 includes the elements of FIG. 12 except for spacer 81 and spacer 41. Using a dry or wet process, each of spacer 81 and spacer 41 can be removed. For example, using a wet etchant selected to remove the dielectric material of spacer 41 and spacer 81 but that does not remove the dielectric material of spacer 51, dielectric 111, ILD 62, PC 30, electrode extension 13A or electrode extension 13B. The etch process exposes the vertical sides of a top portion of resistive liner 52, the top portions of PC 30, and electrode extension 13B. In some embodiments, the top portion of the exposed resistive liner 52 on sidewall can be also selectively removed (not shown).

Figure 14:
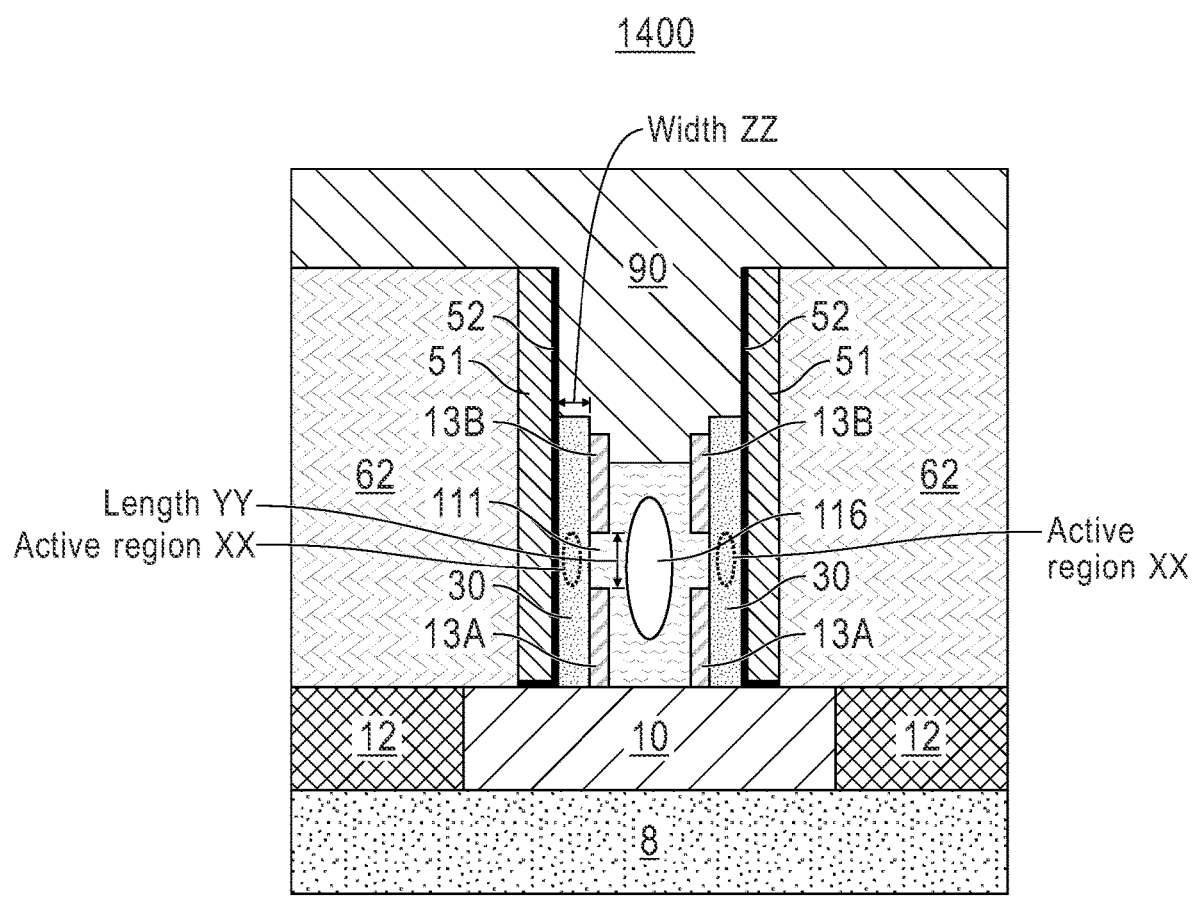
FIG. 14 is a cross-sectional view of the semiconductor structure after depositing the top electrode in accordance with the second embodiment of the present invention.

FIG. 14 is a cross-sectional view of semiconductor structure 1400 after depositing top electrode 90 in accordance with an embodiment of the present invention. As shown in FIG. 13, after the top cavity is formed, the open cavity acts as a via to connect the top electrode 90. A layer of any known electrode material, such as but not limited to TiN, aluminum (Al), tungsten (W), copper (Cu), TaN, or other suitable electrode material can be deposited over semiconductor structure 1400. The deposition of top electrode 90 on dielectric 111 can fill the cavity between the vertical sides of resistive liner 52 and can cover the exposed surfaces of PC 30 and electrode extension 13B. In some embodiments, top electrode 90 is a bit line in a memory device application. For example, top electrode 90 can electrically connect opposing vertical sides of PC 30 and electrode extension 13B. The two segments of electrode extension 13A and the bottom of PC 30 can contact or connect to bottom electrode 10. In some embodiments, bottom electrode 10 is a word line in a memory device application.

Semiconductor structure 1400 depicts one example of a cross-section of a vertical PCM cell that can be formed with two vertical phase change bridge elements on each side of dielectric 111. Each vertical phase change bridge element can include at least a thin vertical layer of PC 30 that connects to top electrode 90 and to bottom electrode 10 and bridges the gap between electrode extension 13A and electrode extension 13B. These two vertical phase change bridge elements are laterally separated by dielectric 111. Electrode extensions 13A and 13B are vertically separated by dielectric 111.

As depicted in FIG. 14, the vertical PCM cell with two vertical phase change bridge elements may be composed of top electrode 90, bottom electrode 10, two thin vertical layers of PC 30 that each abut opposite sides of dielectric 111, two vertical segments of electrode extension 13B under top electrode 90 and residing on the top portion of the inner vertical side of each of the two thin vertical layers of PC 30, two vertical segments of electrode extension 13A on bottom electrode 10 and residing on the bottom portion of the inner vertical side of each of the two thin vertical layers of PC 30, dielectric 111 abutting each of electrode extensions 13A and 13B, a portion of each of the two vertical layers of PC 30 and between a portion of top electrode 90 and a portion of bottom electrode 10. In some embodiments, the vertical PCM cell includes resistive liner 52 on the outside vertical surfaces of each of PC 30. Resistive liner 52 may also abut portions of top electrode 90 on spacer 51 and extend under spacer 51. The two vertical segments of electrode extension 13B are electrically connected to the top electrode 90 and the two vertical segments of electrode extension 13A are electrically connected to the bottom electrode.

As depicted in FIG. 14, the two opposing vertical layers of PC 30 are separated from each other by dielectric 111. The two opposing vertical layers of PC 30 with electrode extensions 13A and 13B separated by dielectric 111 can form a PCM cell or a vertical PCM cell with top electrode 90 and bottom electrode 10. Each of the vertical segments of PC 30 includes or abuts a vertical segment of electrode extension 13A and a vertical segment of electrode extension 13B.

Active region XX can be the region in each of the two vertical layers of PC 30 that bridges the two electrode extensions 13A and 13B which reside on a wall of each of the two opposing vertical sidewalls of PC 30. Active region XX can have a horizontal width ZZ and length YY. Width ZZ can be the horizontal thickness of PC 30 between electrode extensions 13A and 13B. The phase memory material (i.e., PC 30) in active region XX can be induced to change between at least two solid phases, for example, high resistive amorphous state or to a low resistive crystalline state. Two active regions XX reside in semiconductor structure 1400 (i.e., one active region XX on each vertical layer of PC 30). While active region XX is depicted on one side of semiconductor structure 1400 (i.e., in the left most vertical layer of PC 30), as known to one skilled in the art, in semiconductor structure 1400, another active region XX (not depicted) is present in the right most vertical layer of PC 30 between electrode extensions 13A and 13B. Active region XX can be formed between top electrode 90 and bottom electrode in a bridge of one vertical layer of PC 30 that is between one electrode extension 13A and one electrode extension 13B residing on the vertical layer of PC 30.

While semiconductor structure 1400 has two active regions XX forming a single vertical PCM cell, in other embodiments, a single active region in a semiconductor structure forms a vertical PCM cell. For example, as depicted in semiconductor structure 1600A in FIG. 16A, a single active region XX can create a vertical PCM cell with PC 30 bridging electrode extensions 13A and 13B between top electrode 90A and bottom electrode 10.

In the PCM cell or vertical PCM cell that is formed with two vertical phase change bridge elements residing on either side of dielectric 111, current may be supplied to top electrode 90. Top electrode 90 can provide current to the top of the vertical portions of each of the pair of electrode extension 13B and to the two vertical layers of PC 30 in order to change a state of PC 30 (e.g., to or from a resistive amorphous state or to or from a low resistivity crystalline state). Similarly, in the vertical PCM cell depicted in FIG. 14, current may be supplied to or removed from the vertical portions of electrode extension 13A by bottom electrode 10 in order to change a state of PC 30 (e.g., to be a resistive amorphous state or to a low resistivity crystalline state).

As can be appreciated, active region XX can be made extremely small in the illustrated structure, which can help reduce the magnitude or amount of current needed to induce the phase changes. The distance or electrical signal path length between the second electrode extension 13B connecting to top electrode 90 and the first electrode extension 13A connecting to bottom electrode 10 can be defined by the thickness of sacrificial layer 14 shown in FIG. 1. In various embodiments, thickness YY in PC material 30 between electrode extension 13A and electrode extension 13B can be established using a thin film deposition. Using a thin film deposition process can form a very thin layer of sacrificial layer 14 between the layer of electrode extension 13A and the layer of electrode extension 13B in FIG. 1.

In some embodiments, width ZZ is a minimum feature size for a sidewall spacer formation process. For example, an optimized lithographic process for spacer formation (i.e., of spacer 41) used to form PC 30 in the semiconductor structure 1400. In various embodiments, thickness ZZ of active region XX is less than a minimum feature size of the formation processes to form PC 30. For example, the thickness ZZ of active region XX in PC 30 can be determined by a spacer formation process using thin film deposition process, such as but not limited to ALD followed by a selective etch process, such as RIE to form spacer 41 (as shown in FIG. 4). The thickness of spacer 41 can be established using a thin film deposition technique of spacer material on the sidewalls of the HM 15 as depicted in FIG. 4. As can be appreciated, using the thin film deposition process, the thickness ZZ of active region XX in PC 30 between the electrode extension 13A and electrode extension 13B can be well controlled. In this way, an array of vertical bridge memory cells or vertical PCM cells formed using semiconductor structure 1400 can have small performance variations from cell to cell in the array. In some embodiments, the conductance of electrode extensions 13A and 13B is substantially greater than that of the abutting phase change material 30. For example, the conductance of the electrode extensions 13A and 13B can be 5 to 20 times greater than the conductance PC 30 abutting each of electrode extensions 13A and 13B.

In one embodiment (not depicted), the two vertical segments of electrode extensions 13A and 13B are separated by sacrificial layer 14 on PC 30 when the side segments of sacrificial layer 14 are not removed (e.g., as discussed in reference to FIG. 10). In this embodiment, sacrificial layer 14 is composed of a dielectric material. In some embodiments, after patterning of top electrode 90, one or more portions of resistive liner 52, spacer 51, and ILD 62 are exposed.

Figure 15:
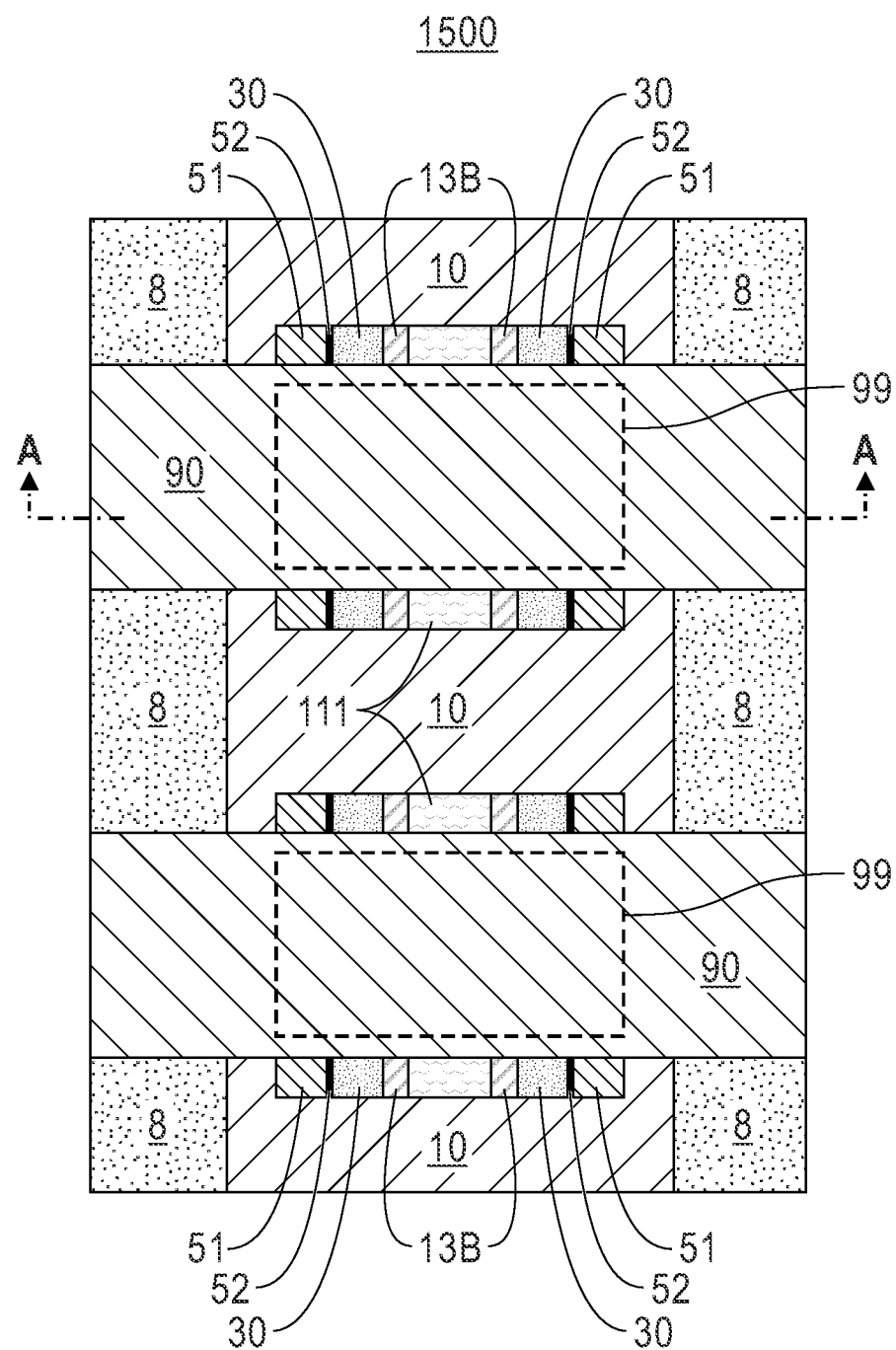
FIG. 15 is a top view of the semiconductor structure through the ILD after depositing the top electrode in accordance with an embodiment of the present invention.

FIG. 15 is a top view of semiconductor structure 1500 through ILD 62 after depositing top electrode 90 in accordance with an embodiment of the present invention. As depicted, FIG. 15 includes a top view of semiconductor structure 1500 with two vertical PCM cells 99 that are depicted with dotted lines on each of the two top electrodes 90. The two vertical PCM cells 99 are each under one of the two depicted top electrodes 90. For example, the top vertical PCM cell 99 on the topmost top electrode 90 forms one vertical PCM cell 99.

Each of the pair of vertical PCM cells 99 can be composed of semiconductor structure 1400 in the cross-section depicted in FIG. 14. As such, the two vertical PCM cells 99 include bottom electrode 10, top electrode 90, PC 30, dielectric 111, electrode extension 13B, electrode extension 13A (not depicted), and optional resistive liner 52. A thin vertical layer of PC 30 resides on each of two opposite sides of dielectric 111 contacting to a portion of top electrode 90 and to a portion of bottom electrode 10. Dielectric 111 which may include void 116 (not depicted) separates the two vertical segments of electrode extensions 13A and 13B and also, separates the two vertical layers of PC 30 where each of layer of PC 30 includes one electrode extension 13A and one electrode extension 13B on a portion of the interior surface of the vertical layer of PC 30. In some embodiments, resistive metal liner 52 is present on the backside or outside vertical face of each layer of PC 30 (e.g., the vertical side opposite the segments of electrode extensions 13A and 13B and dielectric 111) abutting spacer 51. As depicted, the two vertical PCM cells 99 formed each reside on a portion of bottom electrode 10 and are each covered by a top electrode 90. While in FIG. 15 top electrode 90 does not completely cover some top and bottom portions of the top surfaces of spacer 51, resistive liner 52, PC 30, electrode extension 13B and dielectric 111, in other embodiments, top electrode 90 completely covers the top portion of these layers and may extend on to a portion of ILD 62 (not depicted).

While FIG. 15 depicts two vertical PCM cells 99, in other embodiments, any number of vertical PCM cells 99 can be formed between a top electrode 90 and bottom electrode 10 using the self-aligning processes discussed with respect to FIGS. 1-15. For example, four vertical PCM cells 99 can be formed in a line or on a longer bottom electrode 10 with four top electrode 90 (i.e., in a line with four top electrodes 90). In other examples, a matrix or crossbar like structure with four or more vertical PCM cells s 99 when vertical PCM cells 99 are both side by side (e.g., horizontally adjacent) and vertically adjacent in a 2 by 2 matrix. In other cases, a 4 by 4 matrix of vertical PCM cells 99 can form a square-like matrix of vertical PCM cells 99. Using the methods discussed with respect to FIGS. 1-15, any number of vertical PCM cells 99 can be formed on semiconductor substrate 8. In some embodiments, the vertical PCM cells 99 each have a separate bottom electrode.

Figure 16A:
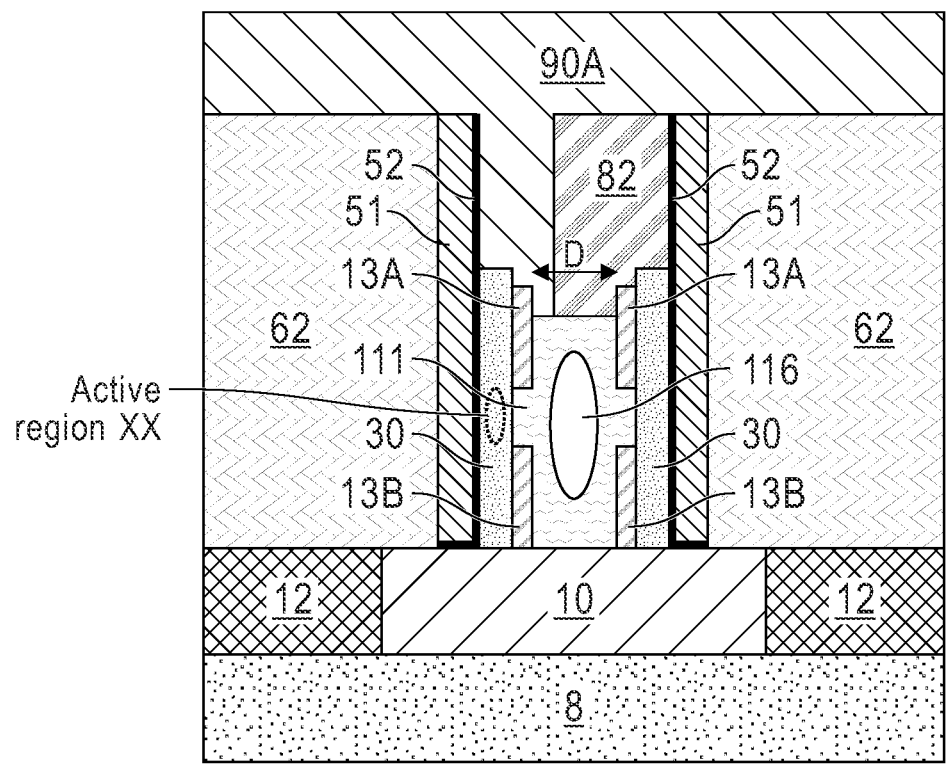
FIG. 16A is a cross-sectional view of the semiconductor structure after depositing, polishing, and selectively etching a layer of an ILD material and forming a top electrode in accordance with a second embodiment of the present invention.

FIG. 16A is a cross-sectional view of semiconductor structure 1600A after depositing, polishing, and selectively etching ILD 82 and depositing top electrode 90A in accordance with a second embodiment of the present invention. As depicted, FIG. 16A includes top electrode 90A, ILD 82, ILD 62, spacer 51, resistive liner 52 (optional), PC 30, active region XX, electrode extension 13A, electrode extension 13B, dielectric 111, void 116, ILD 12, bottom electrode 10, and semiconductor substrate 8. Distance D depicts the space between each vertical layer PC 30. In various embodiments, the processes to form semiconductor structure 1600A and the functionality of the vertical PCM cell formed by semiconductor structure 1600A do not limit distance D (e.g., helps relax mask placement overlay requirements in future operations). Semiconductor structure 1600A depicts an example of a vertical PCM cell where top electrode 90A contacting left side electrode extension 13A connects to bottom electrode 10 contacting left right electrode extension 13B through the vertical layer of PC 30 on the left side of dielectric 111.

Beginning with semiconductor structure 1300 in FIG. 13 that is formed using the processes previously discussed with respect to FIGS. 1-13, in the second embodiment depicted in FIG. 16A, a second layer of an interlayer dielectric, ILD 82 is deposited over semiconductor structure 1300. Using known processes, ILD 82 can be deposited over ILD 12, spacer 51, resistive liner 52, PC 30, electrode extension 13B, and dielectric 111 and then, polished with a CMP, stopping on the top surface of spacer 51. ILD 82 may be patterned, for example, with photolithography, and selectively etched removing a portion of ILD 82 along the left vertical sides of resistive liner 52 exposing the top portion of PC 30 on the left resistive liner 52, the top portion of the left segment of electrode extension 13B on the left resistive liner 52, and a portion of dielectric 111 adjacent to the left segment of electrode extension 13B.

After selective etch of ILD 82, a cavity is created between the remaining ILD 82 and exposed the top left portion of electrode extension 13B and the top portion of the layer of PC 30 on the left resistive liner 52. A layer of electrode material can be deposited over the top surface of ILD 12, spacer 51, the left resistive liner 52, ILD 82, dielectric 111, and over and around exposed surfaces of the top portion of PC 30 on the left resistive liner 52 and the segment of electrode extension 13B on the top portion of PC 30 on the left resistive liner 52. The exposed surfaces of PC 30 and electrode extension 13B reside on the left side of the cavity where ILD 82 was removed. In various embodiments, the layer of electrode material is patterned and selectively etched to form top electrode 90A.

As depicted, electrode 90A directly contacts the top portion of PC 30 on the left side of FIG. 16A and contacts the top portion of the segment of electrode extension 13B on the inner surface of the left vertical layer of PC 30. The left vertical layer of PC 30 contacts bottom electrode 10 and electrode extension 13A that resides in the inner surface of the left vertical layer of PC 30 and on bottom electrode 10. A center portion of each of the two vertical layers of PC 30 abuts dielectric 111 that separates each electrode extension 13A from each electrode extension 13B. Top electrode 90A contacts electrode extension 13A on the left inner surface of the left vertical layer of PC 30 and bottom electrode 10 through the left vertical layer of PC 30 and the leftmost segment of electrode extension 13B forming a vertical PCM cell. Top electrode 90A is electrically connected to the electrode extension 13A on the left inner surface of the left vertical layer of PC 30 and bottom electrode 10 is electrically connected to electrode extension 13A on the left inner surface of the left vertical layer of PC 30. As depicted, active region XX can be formed in the center portion of the left vertical layer of PC 30.

Using self-aligned semiconductor processes to form the two vertical PCM bridge elements, top electrode 90A can be formed to contact the left vertical PCM bridge element. For example, top electrode 90A can contact the left vertical layer of PC 30 and electrode extension 13B on the left side of semiconductor structure 1600A and the left vertical layer of PC 30 also connects to the left side electrode extension 13A and to bottom electrode 10 to form a vertical PCM cell using the left side of semiconductor structure 1600A. For example, as depicted in FIG. 17, vertical PCM cell 109A between top electrode 90A and bottom electrode 10 could be formed with a portion of semiconductor structure 1600A (i.e., using the PCM vertical bridge element formed with the leftmost vertical layer of PC 30). or a PCM vertical bridge for a vertical PCM device.

Figure 16B:
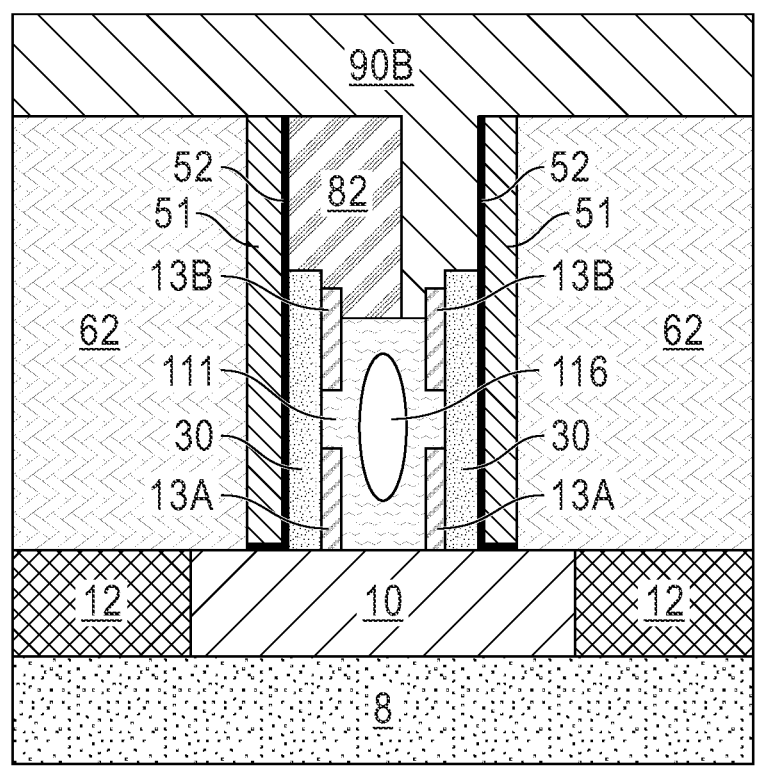
FIG. 16B is the cross-sectional view of the semiconductor structure after depositing, polishing, and selectively etching a layer of the ILD material and forming a second top electrode in accordance with the second embodiment of the present invention.

FIG. 16B is a cross-sectional view of semiconductor structure 1600B after depositing, polishing, and selectively etching ILD 82 and form top electrode 90B in accordance with the second embodiment of the present invention. As depicted, FIG. 16B includes essentially the same or similar elements as FIG. 16A except for a location of ILD 82 and an absence of top electrode 90A that is replaced with top electrode 90B. As discussed above, starting with another semiconductor structure 1300 in FIG. 13 in the second embodiment, the second layer of an interlayer dielectric, such as ILD 82 is deposited over semiconductor structure 1300. Using known processes, ILD 82 is deposited over semiconductor structure 1300, and the top surface of ILD 82 can be polished with a CMP, stopping on the top surface of spacer 51. ILD 82 may be patterned, as discussed above, and selectively etched removing a portion of ILD 82 along the right vertical sides of resistive liner 52. The selective etching of ILD 82 exposes a top portion of the right vertical layer of PC 30, exposes the top portion of the segment of electrode extension 13B on top portion of the right vertical layer of PC 30, and also exposes a portion of the top surface of dielectric 111 adjacent to the right most electrode extension 13B.

A layer of electrode material can be deposited over the top surface of ILD 12, spacer 51, resistive liner 52, ILD 82, dielectric 111, and over and around exposed surfaces of the right hand-side of the top portion of PC 30 and the exposed top right portions of electrode extension 13B. The layer of electrode material can be patterned and etched to form top electrode 90B. As depicted, top electrode 90B directly contacts the top portion of the vertical layer of PC 30 residing on the right side of FIG. 16B (e.g., on the rightmost resistive liner 52) and the top portion of right side electrode extension 13B on the right vertical layer of PC 30. The right vertical layer of PC 30 contacts bottom electrode 10 and electrode extension 13A that is on bottom electrode 10 and on the inner surface of the right vertical layer of PC 30. Top electrode 90B is electrically connected to the electrode extension 13B on the right inner surface of the right vertical layer of PC 30 and bottom electrode 10 is electrically connected to electrode extension 13A on the right inner surface of the right vertical layer of PC 30. In this way, top electrode 90B connects to bottom electrode 10 through the rightmost vertical layer of PC 30.

Figure 17:
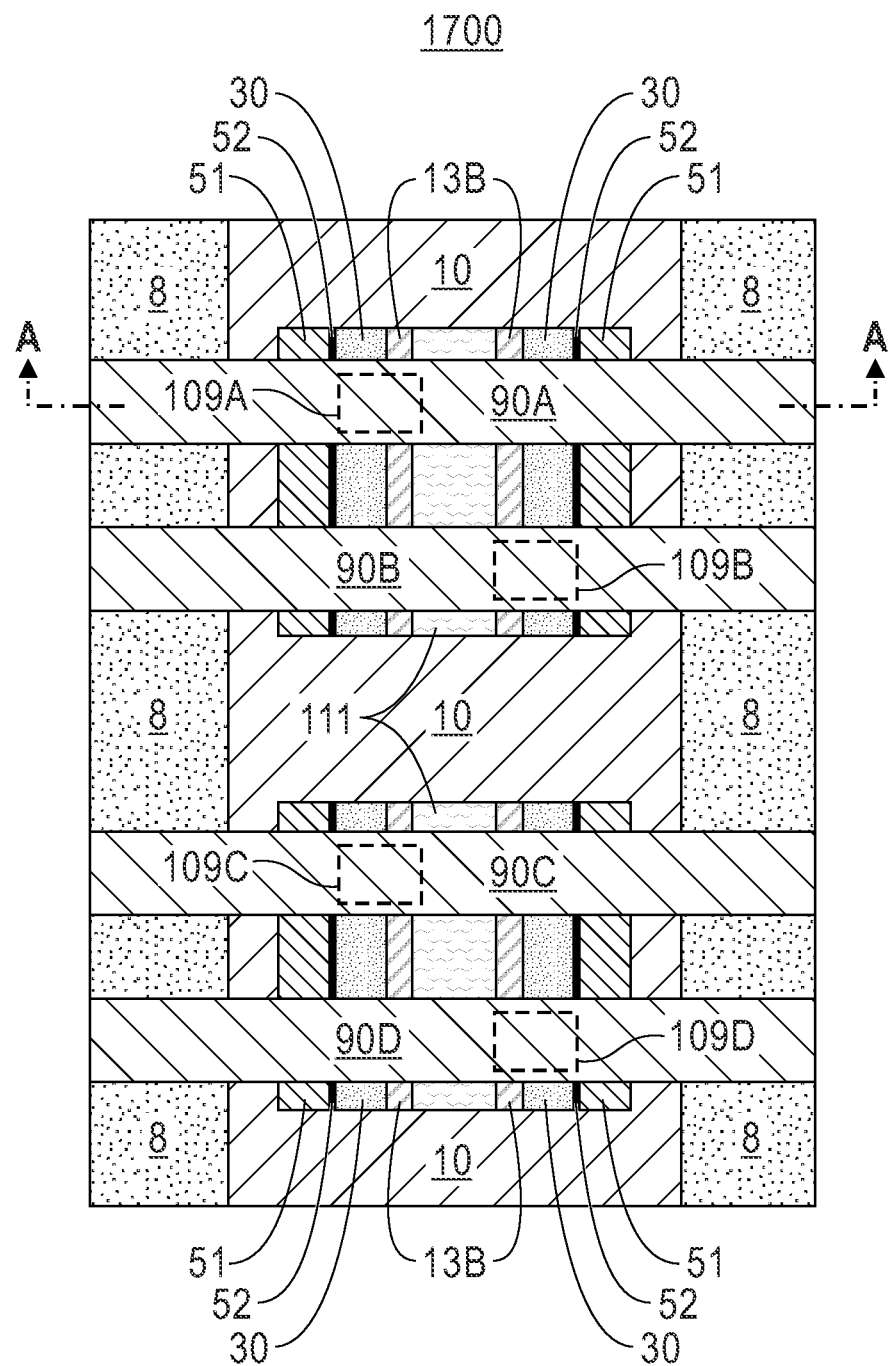
FIG. 17 is a top view of the semiconductor structure through the ILD after depositing the top electrodes in accordance with the second embodiment of the present invention.

Semiconductor structure 1600B depicts one vertical PCM cell, such as vertical PCM cell 109B in FIG. 17, that includes top electrode 90B, the right vertical layer of PC 30, the right side electrode extension 13B, the right side electrode extension 13A, and bottom electrode 10 where electrode extensions 13A and 13B are separated by dielectric 111.

FIG. 17 is a top view of semiconductor structure 1700 through ILD 12 and ILD 82 after depositing top electrodes 90A, 90B, 90C, and 90D in accordance with the second embodiment of the present invention. As depicted, FIG. 17 includes substrate 8, bottom electrode 10, spacer 51, resistive liner 52, PC 30, electrode extension 13B, dielectric 111, top electrodes 90A, 90B, 90C and 90D, vertical PCM cell 109A, 109B, 109C, and 109D indicated by the dotted lines that reside under top electrodes 90A, 90B, 90C, and 90D respectively. Vertical PCM cell 109A and vertical PCM cell 109B are top views of semiconductor structure 1600A and 1600B, respectively. Top electrode 90C and 90D and vertical PCM cells 109C and 109D can be formed with the processes discussed in detail with respect to FIG. 16A and FIG. 16B, respectively. In other words, top electrode 90C connects to the left vertical layer of PC 30 and top electrode 90D connects to the right vertical layer of PC 30 and bottom electrode 10 as previously described in detail with respect to FIGS. 16A and 16B.

FIG. 17 depicts one example of the four vertical PCM cells depicted as vertical PCM cells 109A-109D. Each vertical PCM cell of vertical PCM cells 109A-D is formed by a single vertical phase change bridge element of two vertical phase change bridge elements that connects one top electrode contacting one electrode extension 13B on a top portion of one thin vertical layer of PC 30 to bottom electrode 10 and to one electrode extension 13A that is on a bottom portion of the vertical layer of PC 30.

For example, in each vertical PCM cell 109A-109D, when a top electrode that is one of top electrodes 90A-90D provides an electrical current to the respective electrode extension contacting the top electrode (e.g., one electrode extension 13B contacting the top electrode providing current), then the electrode extension can initiate a phase change (e.g., amorphous to crystalline state), as discussed previously, in PC 30 that directly contacts the electrode extension. For example, when top electrode 90A provides a current to electrode extension 13B, the thermal energy may change the state of PC 30 to a low resistance crystalline state. Changing the state of PC 30 that is in an amorphous state in the vertical PCM cell can switch the vertical PCM cell in an "OFF" or "RE-SET" state to the low resistance or "ON" or "SET" state.

While FIG. 17 depicts four vertical PCM cells 109A-109D, as known to one skilled in the art, in other embodiments, one, two, three, or more than four PCM vertical cells may be formed using the methods disclosed in the present invention. While vertical PCM cells 109A-109D are depicted as arranged or stacked in an essentially vertical manner on bottom electrode 10, in other embodiments, vertical PCM cells 109A-109D can be formed in a 2 by 2 matrix or cross-bar structure where the vertical PCM cells can be horizontally and vertically adjacent to each other. For example, using the methods of the present invention, vertical PCM cells can be formed in a 3 by 3 matrix.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A vertical phase change memory cell, the vertical phase change memory cell comprising:
   a bottom electrode on a portion of a semiconductor substrate;
   a pair of vertical phase change bridge elements that are each on a portion of the bottom electrode separated by a dielectric material, wherein each vertical phase change element includes:
      a vertical layer of a phase change material on a portion of the bottom electrode connecting to the top electrode;
      a first electrode extension abutting a top portion of a side of the vertical layer of the phase change material and the top electrode;

a second electrode extension abutting a bottom portion of the side of the vertical layer of the phase change material and the bottom electrode; and the dielectric material abuts a center portion of the vertical layer of the phase change material, wherein the first electrode extension and the second electrode extension are separated by the center portion of the dielectric material; and a top electrode over the pair of vertical phase change bridge elements.

2. The vertical phase change memory cell of claim 1, wherein an outside surface of the vertical layer of the phase change material in each vertical phase change bridge element of the pair of the vertical phase change bridge elements abuts one of a spacer or a resistive liner.

3. The vertical phase change memory cell of claim 1, wherein an inner surface of the vertical layer of a phase change material in each vertical phase change bridge element abuts the first electrode extension, a portion of the dielectric material in a center portion of the vertical layer of a phase change material, and the second electrode extension.

4. The vertical phase change memory cell of claim 1, wherein the vertical layer of the phase change material in each vertical phase change bridge element of the pair of vertical phase change elements includes an active region in the vertical layer of the phase change material that is between the first electrode extension and the second electrode extension.

5. The vertical phase change memory cell of claim 4, wherein a thickness of the active region is determined, at least in part, by a thin film deposition process in a spacer formation process.

6. The vertical phase change memory cell of claim 4, wherein the active region in the vertical layer of the phase change material that is between the first electrode extension and the second electrode extension is inducible induced to change between at least two solid phases.

7. The vertical phase change memory cell of claim 1, wherein the pair of vertical phase change bridge elements connecting to the top electrode and the bottom electrode through the vertical layer of the phase change material uses an electrical current in an active region of the vertical layer of the phase change material to induce a phase change in the phase change material in both of the pair of vertical phase change bridge elements.

8. The vertical phase change memory cell of claim 1, wherein the dielectric material includes a void a central area between each vertical layer of the phase change material.

9. A vertical phase change memory cell, the vertical phase change memory cell comprising:

a bottom electrode on a portion of a semiconductor substrate;

a pair of vertical phase change bridge elements that are each on a portion of the bottom electrode separated by a dielectric material, wherein each vertical phase change element includes:

a vertical layer of a phase change material on a portion of the bottom electrode connecting to the top electrode;

a first electrode extension abutting a top portion of a side of the vertical layer of the phase change material and the top electrode;

a second electrode extension abutting a bottom portion of the side of the vertical layer of the phase change material and the bottom electrode; and the dielectric material abuts a center portion of the vertical layer of the phase change material, wherein the first electrode extension and the second electrode extension are separated by the center portion of the dielectric material; and a top electrode connecting to one vertical phase change bridge elements to form a vertical phase change memory cell.

10. The vertical phase change memory cell of claim 9, wherein an outside surface of the vertical layer of the phase change material in each vertical phase change bridge element of the pair of vertical phase change bridge elements abuts one of a spacer or a resistive liner.

11. The vertical phase change memory cell of claim 9, wherein an inner surface of the vertical layer of a phase change material in each vertical phase change bridge element abuts the first electrode extension, a portion of the dielectric material in a center portion of the vertical layer of a phase change material, and the second electrode extension.

12. The vertical phase change memory cell of claim 9, wherein the vertical layer of the phase change material in each vertical phase change bridge element of the pair vertical phase change elements includes an active region in the vertical layer of the phase change material that is between the first electrode extension and the second electrode extension.

13. The vertical phase change memory cell of claim 12, wherein a thickness of the active region is determined, at least in part, by a thin conformal deposition process in a sidewall spacer formation process.

14. The vertical phase change memory cell of claim 12, wherein the active region that in the vertical layer of the phase change material that is between the first electrode extension and the second electrode extension is inducible to change between at least two solid phases.

15. The vertical phase change memory cell of claim 9, wherein the pair of vertical phase change elements are formed using self-aligning semiconductor processes.

16. The vertical phase change memory cell of claim 9, wherein the dielectric material includes a void a central area between each vertical layer of the phase change material.

* * * * *